(12) United States Patent
Arai et al.

(10) Patent No.: US 7,799,673 B2
(45) Date of Patent: Sep. 21, 2010

(54) SEMICONDUCTOR DEVICE MANUFACTURING METHOD

(75) Inventors: Shinya Arai, Yokohama (JP); Akihiro Kojima, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 216 days.

(21) Appl. No.: 12/122,015

(22) Filed: May 16, 2008

(65) Prior Publication Data
US 2008/0286961 A1    Nov. 20, 2008

(30) Foreign Application Priority Data
May 18, 2007   (JP)  ............... 2007-132854

(51) Int. Cl.
*H01L 21/4763*  (2006.01)
*H01L 23/48*    (2006.01)
*H01L 23/52*    (2006.01)
*H01L 29/40*    (2006.01)

(52) U.S. Cl. ............ 438/623; 438/633; 438/637; 438/642; 438/643; 438/738; 438/627; 438/622; 438/401; 257/759; 257/797; 257/E23.179

(58) Field of Classification Search ............... 438/623, 438/627, 633, 637–642, 735, 738, 622, 401; 257/759, 797, E23.179
See application file for complete search history.

(56) References Cited

U.S. PATENT DOCUMENTS

| 4,632,724 A  | * | 12/1986 | Chesebro et al. ........... 438/8 |
| 7,057,286 B2 |   | 6/2006  | Usami |
| 7,242,096 B2 |   | 7/2007  | Kanamura |
| 2005/0196951 A1 | * | 9/2005 | Lin et al. ............ 438/622 |
| 2006/0166482 A1 |   | 7/2006 | Kanamura |
| 2006/0186548 A1 | * | 8/2006 | Enomoto et al. ......... 257/758 |

FOREIGN PATENT DOCUMENTS

JP    2004-319616    11/2004

* cited by examiner

*Primary Examiner*—Ha Tran T Nguyen
*Assistant Examiner*—Aaron A Dehne
(74) *Attorney, Agent, or Firm*—Finnegan, Henderson, Farabow, Garrett & Dunner, L.L.P.

(57) ABSTRACT

A semiconductor device manufacturing method includes: forming a via pattern in an insulating film by use of an alignment mark of a lower wiring line; forming, by use of an alignment mark of the via pattern, an upper wiring groove pattern in an upper insulating film in which the via pattern is embedded; and repeating etching in a self-aligning manner to form a via and a wiring groove in an insulating film previously stacked under the insulating film in which the via pattern has been formed.

9 Claims, 8 Drawing Sheets

SEMICONDUCTOR DEVICE MANUFACTURING METHOD

CROSS REFERENCE TO RELATED APPLICATION

This application claims benefit of priority under 35USC §119 to Japanese patent application No. 2007-132854, filed on May 18, 2007, the contents of which are incorporated by reference herein.

BACKGROUND OF THE INVENTION

1. Field of the Invention

The present invention relates to a semiconductor device manufacturing method, and more particularly, it is directed to, for example, dual damascene processing of a multilevel wiring layer having a hybrid structure.

2. Related Background Art

In the manufacture of a semiconductor device having multilevel wiring lines, a multilevel wiring layer having a so-called hybrid structure has recently been widely used which includes, in an interlayer insulating film, a stack of two kinds of films of different materials, for example, a carbon-containing silicon oxide (SiOC) film and an organic insulating film, in order to produce a good dual damascene shape.

When a dual damascene method is applied to the formation of the multilevel wiring layer of the hybrid structure, there has been a problem that the organic insulating film is also easily damaged during the removal of a resist because the composition of the organic insulating film is close to the composition of the resist used for a pattern (e.g., refer to Japanese Laid Open (Kokai) 2004-319616, paragraph number (0004)). In order to avoid such a problem, a method has heretofore been used which forms a via pattern after the formation of a wiring groove pattern (e.g., refer to Japanese Laid Open (Kokai) 2004-319616, in particular, FIGS. 1 to 6 and paragraph numbers (0056) to (0078)).

However, in such a manufacturing method which first produces the wiring groove, both the wiring groove pattern and the via pattern are aligned with a lower embedded wiring line, so that the wiring groove and a via are indirectly aligned. Therefore, a margin between the adjacent via and wiring line may decrease depending on the amounts and directions of displacement in their alignments. This is explained in specific terms taking the manufacturing method in Japanese Laid Open (Kokai) 2004-319616 as an example.

In the manufacturing method in Japanese Laid Open (Kokai) 2004-319616, the thickness of a step of a foundation layer is reduced to about 50 nm to increase the accuracy of a resist mask having a via pattern (refer to paragraph number (0062) and FIG. 3(c)), so that even if a via pattern 14' is to be aligned with an already formed wiring groove pattern 10' for an upper embedded wiring line, it is not possible to obtain an adequate alignment signal because an alignment mark of the wiring groove pattern formed on a dicing line on the periphery of a chip is formed at the same thickness (about 50 nm). As a via connects a lower embedded wiring line 28 and the upper embedded wiring line, the via pattern 14' has to be aligned with the lower embedded wiring line 28 if it can not be aligned with the upper embedded wiring line. Thus, the via pattern 14' is aligned with the lower embedded wiring line 28 using an alignment mark of the lower embedded wiring line 28 formed on the dicing line simultaneously with the lower embedded wiring line 28. When, for example, the directions of misalignments at this point are opposite to each other and the amounts of the misalignments are great, a margin between the via and the adjacent upper embedded wiring line of a different potential becomes small in a manufactured semiconductor device, so that there has been a problem of a possible short circuit trouble occurring between the via and wiring line that are adjacent to each other.

FIGS. 16A and 16B are diagrams explaining the disadvantage of the dual damascene method according to the above-mentioned conventional art which first produces the wiring groove pattern. FIG. 16A is a partial plan view of one example of a wiring structure formed by the conventional art, and FIG. 16B is a sectional view along the A-A line in FIG. 16A.

As shown in FIGS. 16A and 16B, upper embedded wiring lines M21, M22 are shifted by ST1 to the right in FIGS. 16A and 16B with respect to lower embedded wiring lines M11, M12, while a via pattern V2 is shifted by ST2 or more to the left in FIGS. 16A and 16B with respect to the lower embedded wiring line M11. As a result, a margin MG between the via pattern V2 and the adjacent upper embedded wiring line M22 of a different potential is extremely narrow.

Such a problem is more evident when the distance between wiring lines is more reduced due to the advanced miniaturization of wiring lines.

SUMMARY OF THE INVENTION

According to a first aspect of the present invention, there is provided a semiconductor device manufacturing method comprising:

forming a via pattern in an insulating film by use of an alignment mark of a lower wiring line;

forming, by use of an alignment mark of the via pattern, an upper wiring groove pattern in an upper insulating film in which the via pattern is embedded; and repeating etching in a self-aligning manner to form a via and a wiring groove in an insulating film previously stacked under the insulating film in which the via pattern has been formed.

According to a second aspect of the present invention, there is provided a semiconductor device manufacturing method comprising:

sequentially forming first to fourth insulating films and first to third hard masks on a substrate in which a wiring layer serving as a lower embedded wiring line is formed;

aligning a mask in which a mask pattern corresponding to a via pattern is formed with the embedded wiring layer to selectively remove the third hard mask and the second hard mask in order to form the via pattern;

aligning a mask in which a mask pattern corresponding to a wiring groove pattern is formed with the via pattern to selectively remove the third hard mask and part of the second hard mask in order to form the wiring groove pattern;

selectively removing the first hard mask and the fourth insulating film using the second hard mask as an etching mask to form a via pattern in the first hard mask and the fourth insulating film in a self-aligning manner, and also removing part of the second hard mask remaining under the bottom surface of the wiring groove pattern;

selectively removing the first hard mask using the second hard mask in which the wiring groove pattern is formed as an etching mask after the removal of the third hard mask to form a wiring groove pattern in the first hard mask in a self-aligning manner;

selectively removing the third insulating film using the fourth insulating film having the via pattern as an etching mask to form a via pattern in the third insulating film in a self-aligning manner;

selectively removing the fourth insulating film using the first hard mask having the wiring groove pattern as an etching mask to form a wiring groove pattern in the fourth insulating film in a self-aligning manner, and also selectively removing the second insulating film using the fourth insulating film having the via pattern as an etching mask to form a via pattern in the second insulating film in a self-aligning manner;

selectively removing the first insulating film using the third insulating film having the via pattern as an etching mask to form an opening reaching the wiring layer, after the removal of the second hard mask;

selectively removing the third insulating film using the first hard mask having the wiring groove pattern as an etching mask to form a wiring groove pattern in the third insulating film in a self-aligning manner; and embedding conductors in the wiring groove pattern and the via pattern to form a via and an upper wiring line connected to the lower embedded wiring line through the via.

DETAILED DESCRIPTION OF THE INVENTION

An embodiment of the present invention will hereinafter be described with reference to the drawings.

FIGS. 1 to 15 are schematic sectional views explaining one embodiment of a semiconductor device manufacturing method according to the present embodiment. The present embodiment provides a method of forming a multilevel wiring layer of a hybrid structure in a dual damascene process which first produces a via, wherein a wiring groove pattern is formed after a via pattern has been formed. It is characterized in that, as described later in detail with reference to FIG. 4, the wiring groove pattern is formed so that it is directly aligned with the via pattern.

Figure 1:
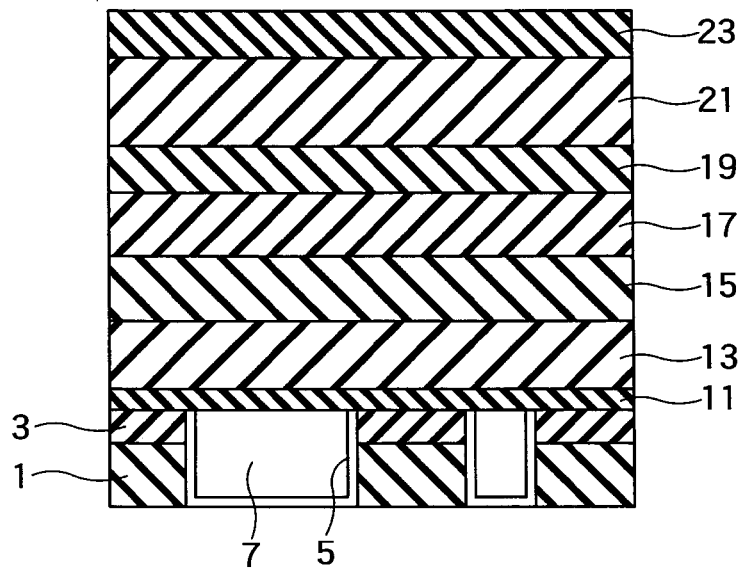
FIGS. 1 to 15 are schematic sectional views explaining one embodiment of a semiconductor device manufacturing method according to the present invention.

As shown in FIG. 1, a lower embedded wiring line 7 is formed by embedding, via a barrier metal 5, copper (Cu) into an inter-wiring insulating film which includes an organic film 1 formed on an unshown foundation insulating film formed on the surface of an unshown substrate and a carbon-containing silicon oxide (SiOC) film 3. First, a silicon carbide (SiC) film 11 is formed on the entire surfaces of the inter-wiring insulating film and the lower embedded wiring line 7. The silicon carbide (SiC) film 11 corresponds to, for example, a first insulating film in the present embodiment. The silicon carbide (SiC) film 11 is used for the prevention of the diffusion of an etching stopper film and a wiring material (Cu), and is, for example, 35 nm in thickness.

Then, a carbon-containing silicon oxide (SiOC) film 13 having a relative dielectric constant of, for example, 2.3 is formed on the silicon carbide (SiC) film 11. The carbon-containing silicon oxide (SiOC) film 13 corresponds to, for example, a second insulating film in the present embodiment. The thickness of the carbon-containing silicon oxide (SiOC) film 13 is, for example, 75 nm. The silicon carbide (SiC) film 11 and the carbon-containing silicon oxide (SiOC) film 13 are used as interlayer insulating films in which a via is formed in the subsequent step (see FIG. 14).

Furthermore, an organic polymer containing carbon as the main component, for example, a poly arylene ether (PAE) film 15 is formed on the carbon-containing silicon oxide (SiOC) film 13. The poly arylene ether (PAE) film 15 corresponds to, for example, a third insulating film in the present embodiment, and has a relative dielectric constant of, for example, 2.3 and a thickness of, for example, 90 nm. The poly arylene ether (PAE) film 15 is used as an inter-wiring insulating film forming a wiring groove (see FIG. 14).

Thus, the second insulating film and the third insulating film are formed using different materials, such that it is possible to more easily control the depth of a groove when the wiring groove is formed in such a manner as to ensure etching selectivity.

Then, a carbon-containing silicon oxide (SiOC) film 17 is formed on the poly arylene ether (PAE) film 15. The carbon-containing silicon oxide (SiOC) film 17 corresponds to, for example, a fourth insulating film in the present embodiment, and is used as a protective film of the poly arylene ether (PAE) film 15 and forms an upper layer of the wiring groove after chemical and mechanical polishing (hereinafter simply referred to as "CMP") (see FIG. 15). To function as the protective film of the poly arylene ether (PAE) film 15, a low relative dielectric constant and a high mechanical strength capable of resisting the CMP process are required. Thus, in the present embodiment, the carbon-containing silicon oxide (SiOC) film 17 has a relative dielectric constant of 3.0, a Young's modulus of 7 Gpa or more, and a thickness of 80 nm.

Then, a silicon nitride (SiN) film 19 is formed on the carbon-containing silicon oxide (SiOC) film 17. The silicon nitride (SiN) film 19 corresponds to, for example, a first hard mask in the present embodiment, and is required to have a thickness enough to resist etching when the wiring groove pattern is formed in the carbon-containing silicon oxide (SiOC) film 17 (see FIG. 11) and when the via pattern is formed in the silicon carbide (SiC) film 11 (see FIG. 12). In the present embodiment, the thickness of the silicon nitride (SiN) film 19 is, for example, 60 nm.

Then, a silicon oxide ($SiO_2$) film 21 is formed on the silicon nitride (SiN) film 19. The silicon oxide ($SiO_2$) film 21 corresponds to, for example, a second hard mask in the present embodiment, and has a thickness of, for example, 100 nm which is larger than the thickness of the silicon nitride (SiN) film 19.

Furthermore, a silicon nitride (SiN) film 23 is formed on the silicon oxide ($SiO_2$) film 21. The silicon nitride (SiN) film 23 corresponds to, for example, a third hard mask in the present embodiment, and has a thickness of, for example, 50 nm which is enough to resist etching when the silicon oxide ($SiO_2$) film 21 is selectively removed.

Figure 2:
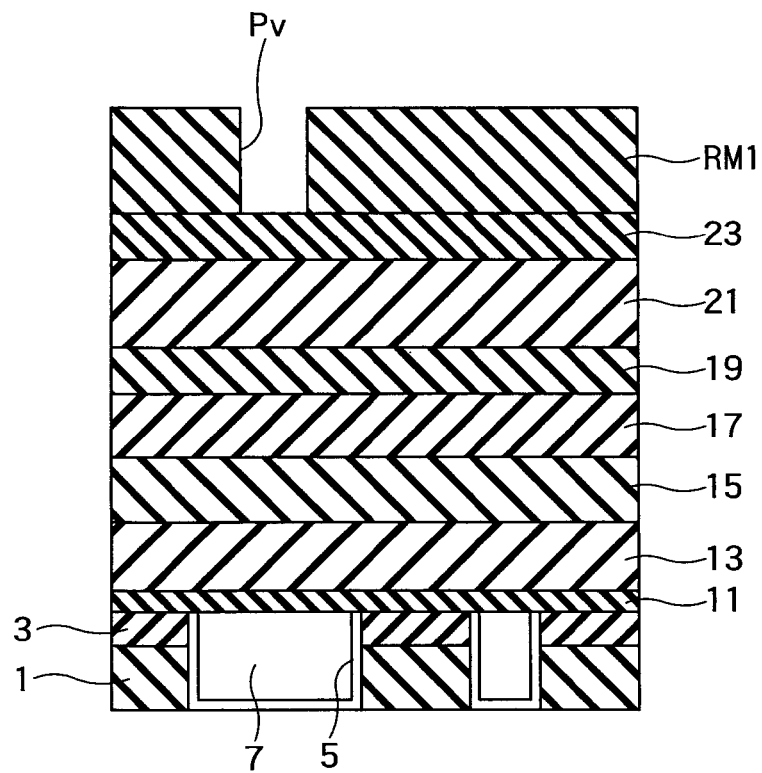
Figure 3:
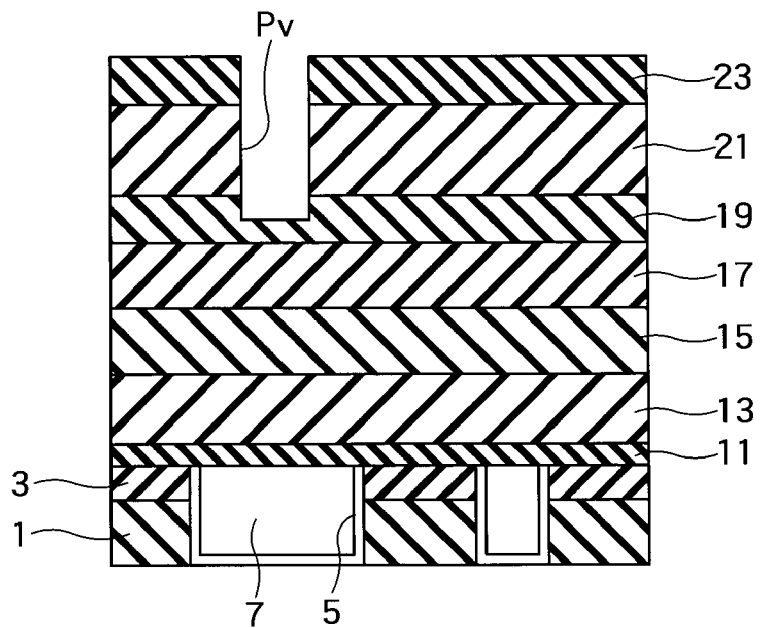

Then, as shown in FIG. 2, a resist mask RM1 having a via pattern Pv is formed on the third hard mask 23. The mask at this point is aligned using an alignment mark of the lower embedded wiring line 7 formed simultaneously with the lower embedded wiring line 7. The alignment mark is formed on a dicing line of the unshown substrate by patterning using a resist. Further, the resist mask RM1 is used as an etching mask to selectively remove the silicon nitride (SiN) film 23 and the silicon oxide ($SiO_2$) film 21 by etching, thereby forming the via pattern Pv, as shown in FIG. 3. For this etching, a mixed gas of carbon octafluoride ($C_4C_8$)/carbon monoxide (CO)/argon (Ar) is used, and the etching selectivity ($SiO_2$/SiN) between the silicon oxide ($SiO_2$) film 21 and the silicon nitride (SiN) film 19 is set to 10 or more, so that the silicon nitride (SiN) film 19 is controlled to prevent it from being penetrated, and the surface of the carbon-containing silicon oxide (SiOC) film 17 immediately under the silicon nitride (SiN) film 19 is not exposed during subsequent resist ashing.

Figure 4:
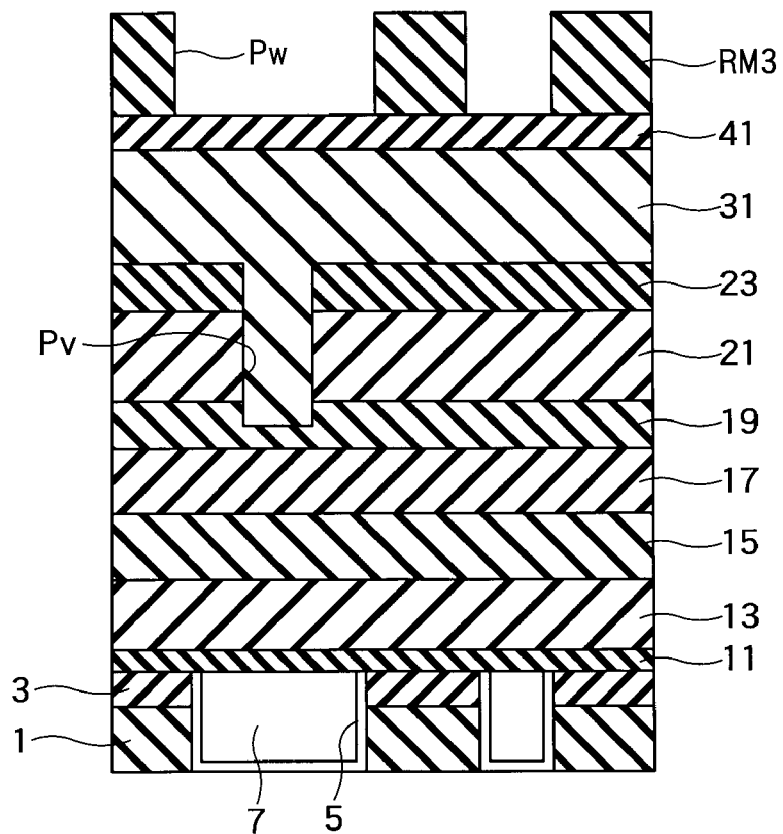

Then, after the removal of the resist mask RM1, as shown in FIG. 4, an organic material novolak polymer is embedded in the via pattern Pv, and a planarizing layer 31 is formed on the silicon nitride (SiN) film 23. Further, a silicon oxide (SiO$_2$) film 41 serving as a mask when the planarizing layer 31 is selectively removed by etching is formed on the planarizing layer 31. Then, a resist mask RM3 having a wiring groove pattern Pw is formed on the silicon oxide (SiO$_2$) film 41. At this point, the mask used in forming the wiring groove pattern Pw in the resist mask RM3 is aligned with the via pattern Pv not using the lower embedded wiring line 7 but using the alignment mark formed on the dicing line of the unshown substrate simultaneously with the formation of the via pattern Pv in the resist mask RM1. This is one of the characteristic points of the present embodiment. The bottom surface of the via pattern Pv reaches the inside of the silicon nitride (SiN) film 19, so that its alignment mark has, when formed in the same shape as, for example, that of the via pattern Pv, a depth of about 200 nm similar to the depth of the via pattern Pv. It is therefore extremely easy to align the wiring groove pattern Pw with the via pattern Pv. As a result, even with the difficulty in scale, it is highly unlikely that a short circuit is caused between the via pattern and an adjacent upper wiring line of a different potential.

Figure 5:
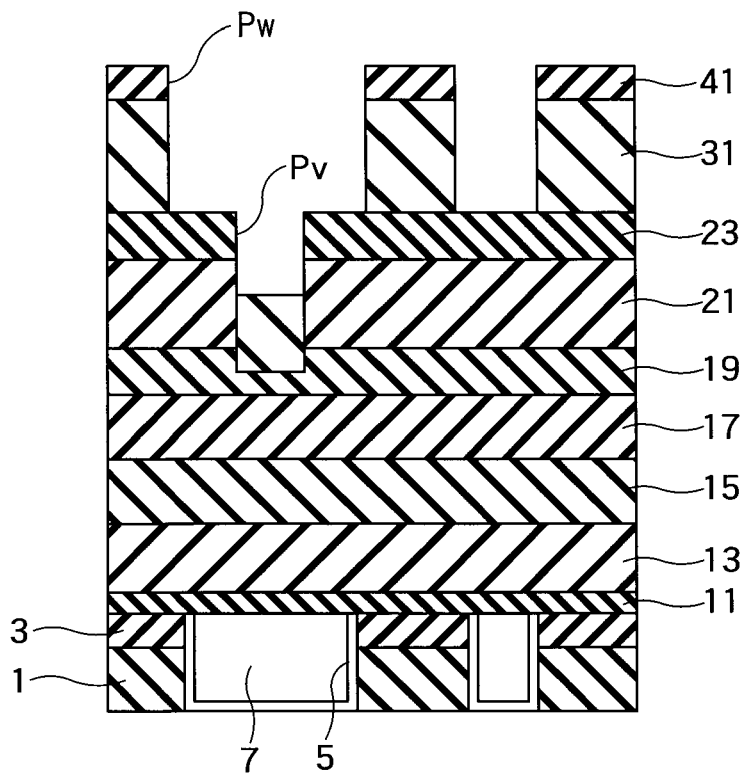

Then, the resist mask RM3 is used as an etching mask to selectively remove the silicon oxide (SiO$_2$) film 41 by etching, thereby forming the wiring groove pattern Pw in the silicon oxide (SiO$_2$) film 41, as shown in FIG. 5. Further, the silicon oxide (SiO$_2$) film 41 in which the wiring groove pattern Pw is formed is used as an etching mask to selectively remove the planarizing layer 31 by etching, thereby forming, in a self-aligning manner, the wiring groove pattern Pw in a part within the planarizing layer 31 over the silicon nitride (SiN) film 23. At this point, part of the planarizing layer 31 embedded in the via pattern Pv is dropped partway in the via so that the silicon nitride (SiN) film 19 may not be exposed.

Figure 6:
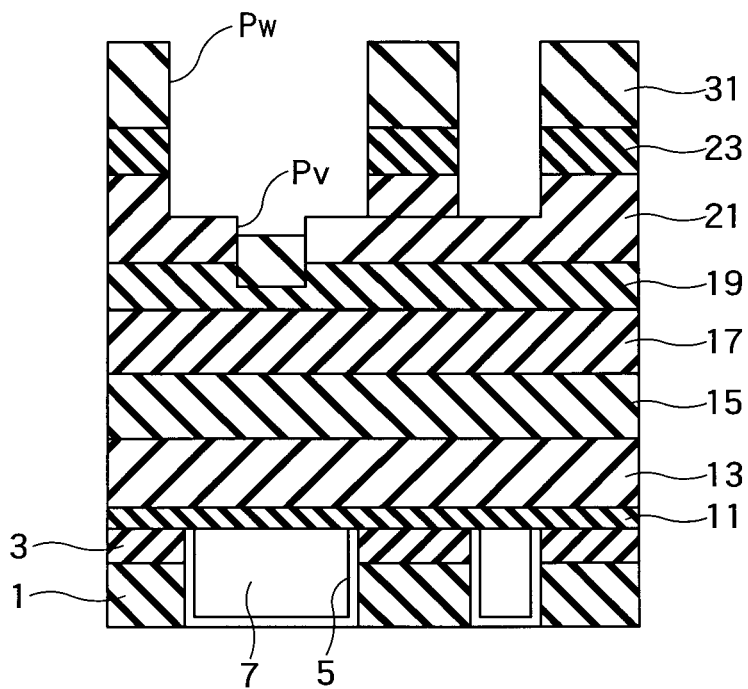

Then, the resist mask RM3 is removed, and the silicon oxide (SiO$_2$) film 41 having the wiring groove pattern Pw and the planarizing layer 31 are used as etching masks to selectively remove, by etching, the silicon nitride (SiN) film 23 and the silicon oxide (SiO$_2$) film 21 up to part of the silicon oxide (SiO$_2$) film 21, so that the wiring groove pattern Pw is formed in the silicon nitride (SiN) film 23 and (part of) the silicon oxide (SiO$_2$) film 21 in a self-aligning manner, as shown in FIG. 6.

Figure 7:
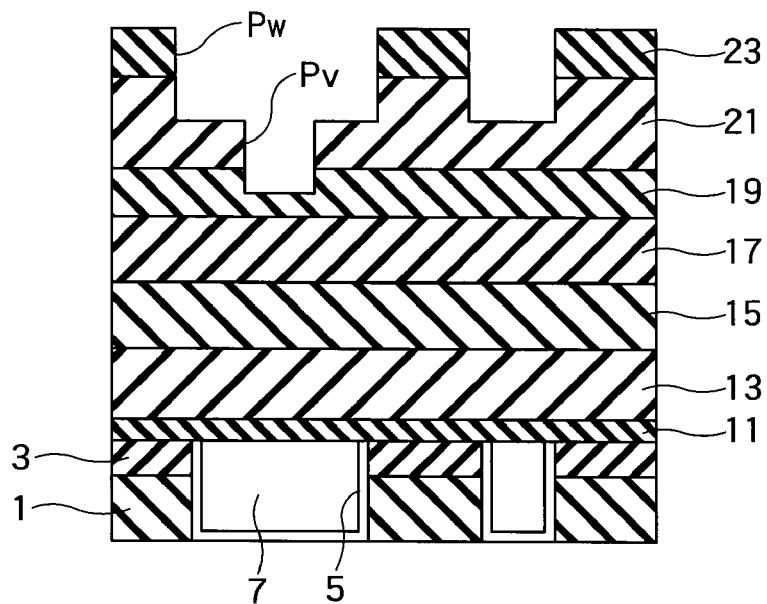

Then, the silicon oxide (SiO$_2$) film 41 is removed, and, as shown in FIG. 7, the planarizing layer 31 is removed by ashing. It should be noted that, at this stage, the via pattern Pv is formed in the silicon nitride (SiN) film 19 and the silicon oxide (SiO$_2$) film 21, and the wiring groove pattern Pw is formed in the silicon nitride (SiN) film 23, and therefore, there will be no need for the process of forming or removing resist masks in subsequent processes. This solves the problem of the conventional art that the organic insulating film is damaged during the removal of the resist.

Figure 8:
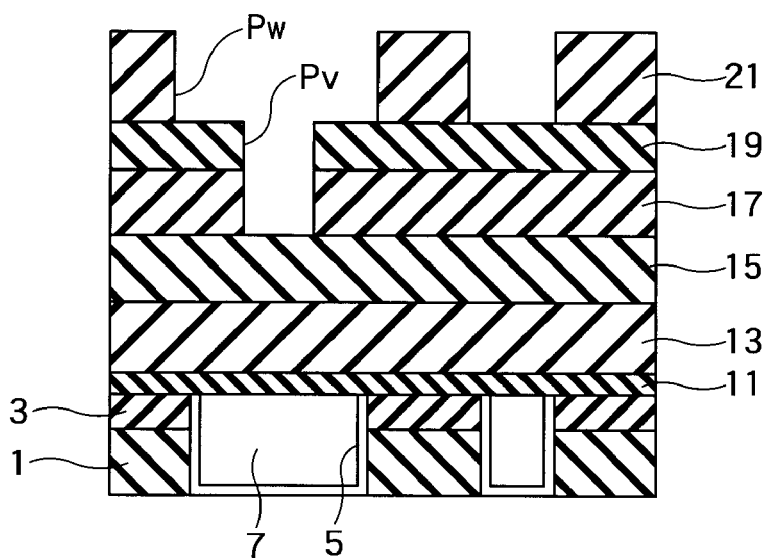

Then, the silicon oxide (SiO$_2$) film 21 having the via pattern Pv is used as an etching mask to selectively remove the silicon nitride (SiN) film 19 and the carbon-containing silicon oxide (SiOC) film 17 by etching, and, as shown in FIG. 8, the bottom surface of the via pattern Pv is dug down in a self-aligning manner until the upper surface of the poly arylene ether (PAE) film 15 is exposed. At the same time, the silicon nitride (SiN) film 23 having the wiring groove pattern Pw is used as an etching mask to selectively remove the silicon oxide (SiO$_2$) film 21 by etching, and the bottom surface of the wiring groove pattern Pw is dug down in a self-aligning manner until the upper surface of the silicon nitride (SiN) film 19 is exposed. Subsequently, the silicon nitride (SiN) film 23 is removed.

Figure 9:
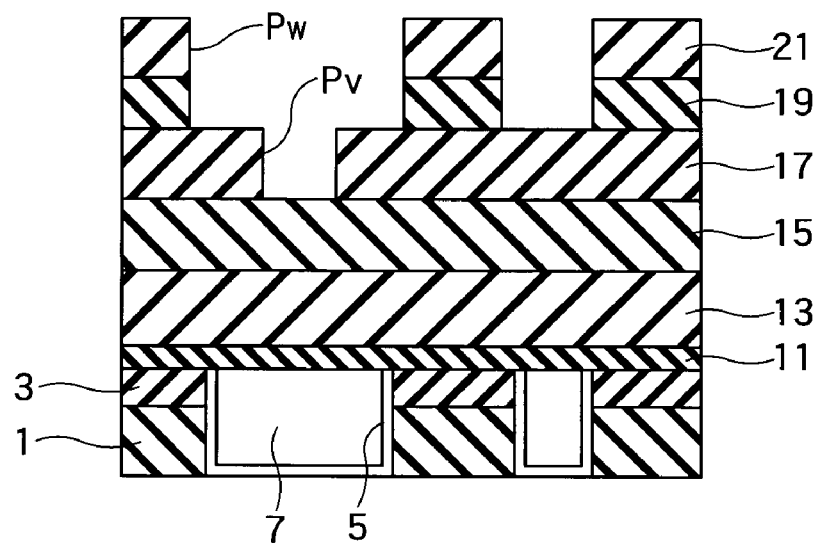

Then, as shown in FIG. 9, the silicon oxide (SiO$_2$) film 21 having the wiring groove pattern Pw is used as an etching mask to selectively remove the silicon nitride (SiN) film 19 by etching, thereby forming the wiring groove pattern Pw in the silicon nitride (SiN) film 19 in a self-aligning manner.

Figure 10:
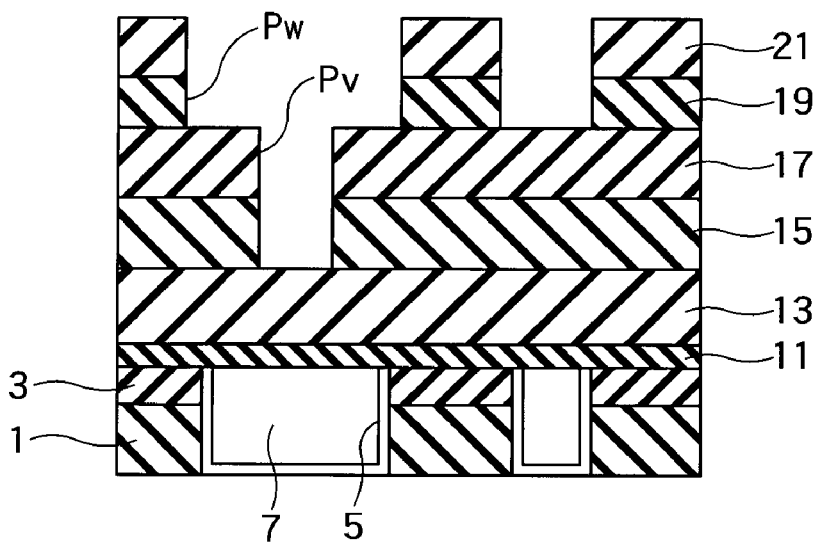

Then, as shown in FIG. 10, the carbon-containing silicon oxide (SiOC) film 17 having the via pattern Pv is used as an etching mask to selectively remove the poly arylene ether (PAE) film 15 by etching, thereby forming the via pattern Pv in the poly arylene ether (PAE) film 15 in a self-aligning manner. For this etching, gases which contain no oxygen, for example, an ammonia (NH$_3$) gas and a nitrogen (N$_2$)/hydrogen (H$_2$) gas are used, such that the poly arylene ether (PAE) film 15 alone can be selectively removed. Therefore, the silicon oxide (SiO$_2$) film 21, the carbon-containing silicon oxide (SiOC) film 17 and the carbon-containing silicon oxide (SiOC) film 13 are hardy removed by the above-mentioned etching.

Figure 11:
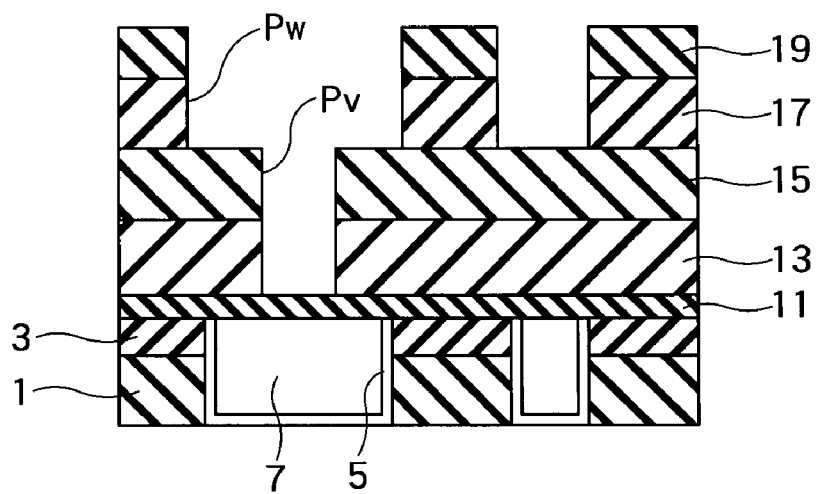

Then, the silicon oxide (SiO$_2$) film 21 having the wiring groove pattern Pw and the silicon nitride (SiN) film 19 are used as etching masks to selectively remove the carbon-containing silicon oxide (SiOC) film 17 by etching, thereby forming the wiring groove pattern Pw in the carbon-containing silicon oxide (SiOC) film 17 in a self-aligning manner. At the same time, as shown in FIG. 11, the poly arylene ether (PAE) film 15 is used as an etching mask to selectively remove the carbon-containing silicon oxide (SiOC) film 13, thereby forming the via pattern Pv in the carbon-containing silicon oxide (SiOC) film 13 in a self-aligning manner so that the via pattern Pv may reach the silicon carbide (SiC) film 11. The silicon oxide (SiO$_2$) film 21 is removed by this etching.

Figure 12:
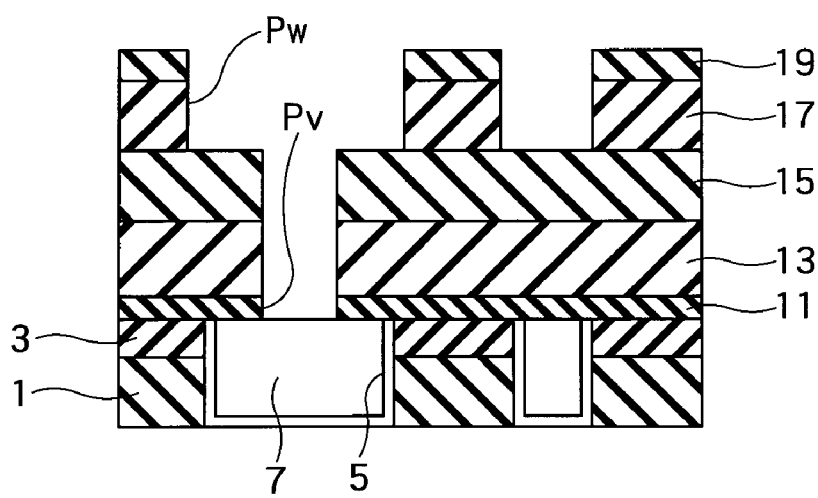

Then, the poly arylene ether (PAE) film 15 having the via pattern Pv is used as an etching mask to selectively remove the silicon carbide (SiC) film 11 by etching, thereby forming an opening reaching the lower embedded wiring line 7, as shown in FIG. 12.

Figure 13:
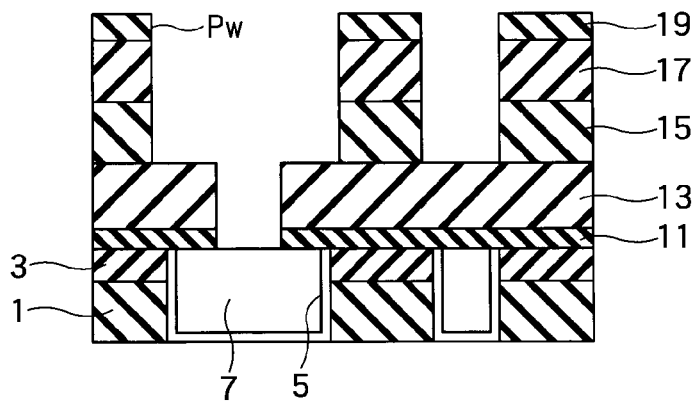

Then, as shown in FIG. 13, the silicon nitride (SiN) film 19 having the wiring groove pattern Pw is used as an etching mask to selectively remove the poly arylene ether (PAE) film 15 by etching, thereby forming the wiring groove pattern Pw in the poly arylene ether (PAE) film 15 in a self-aligning manner. For this etching, gases which contain no oxygen, for example, an ammonia (NH$_3$) gas and a nitrogen (N$_2$)/hydrogen (H$_2$) gas are used, such that the poly arylene ether (PAE) film 15 alone can be selectively removed. Therefore, the silicon nitride (SiN) film 19 and the carbon-containing silicon oxide (SiOC) film 13 are hardy removed, so that the depth of the wiring groove can be easily controlled.

Figure 14:
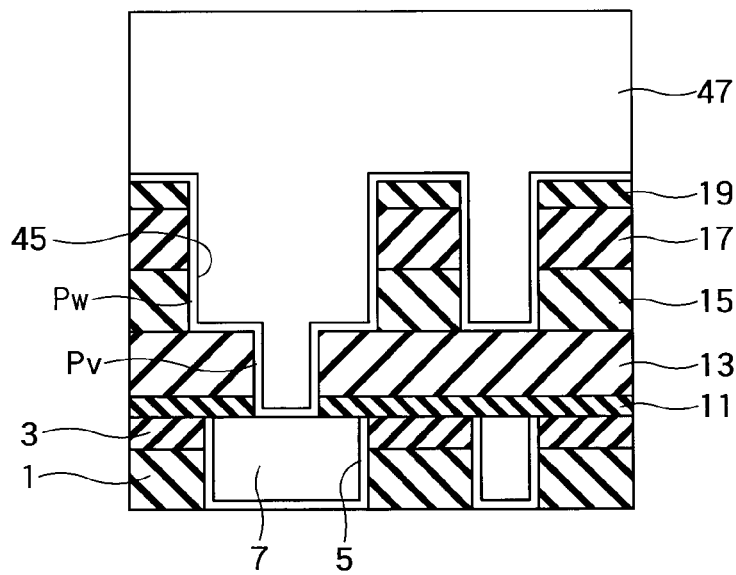

Then, as shown in FIG. 14, a barrier metal 45 is formed so as to cover the inner walls of the wiring groove pattern Pw and the via pattern Pv. The barrier metal 45 is, for example, a metal film containing tantalum (Ta), and can be formed by, for example, a sputter method. Subsequently, a copper (Cu) film 47 is formed on the barrier metal 45 by, for example, electrolytic plating method.

Figure 15:
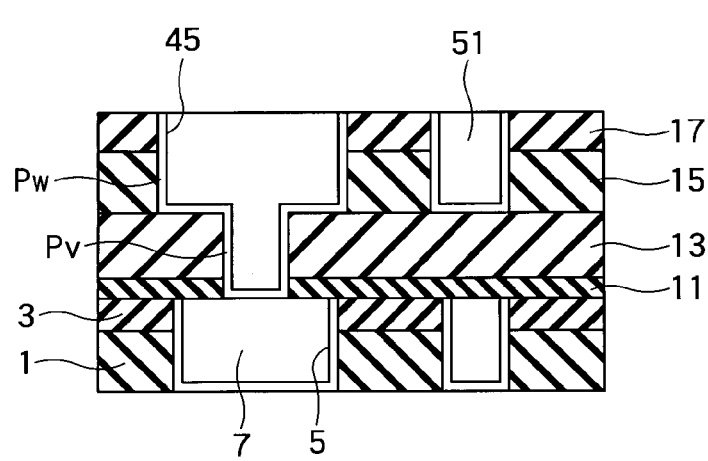
Figure 16A:
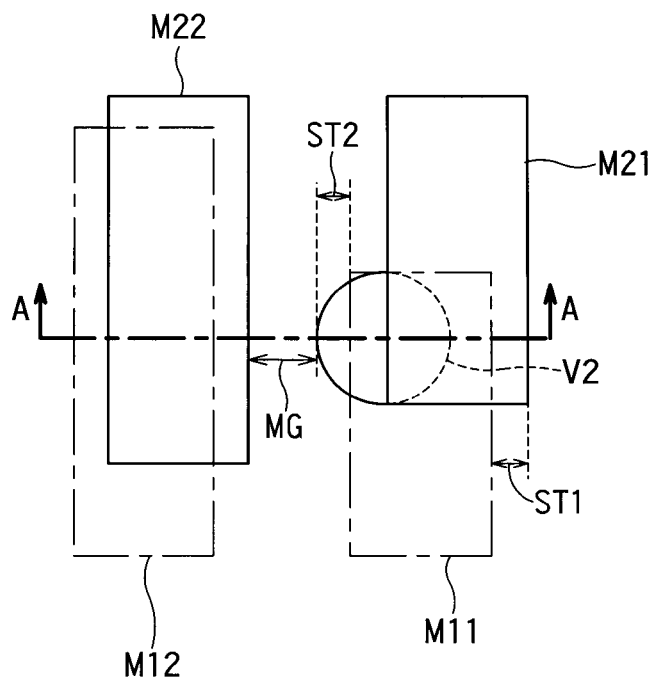
FIGS. 16A and 16B are schematic sectional views explaining the problem of a semiconductor device manufacturing method according to a conventional art.
Figure 16B:
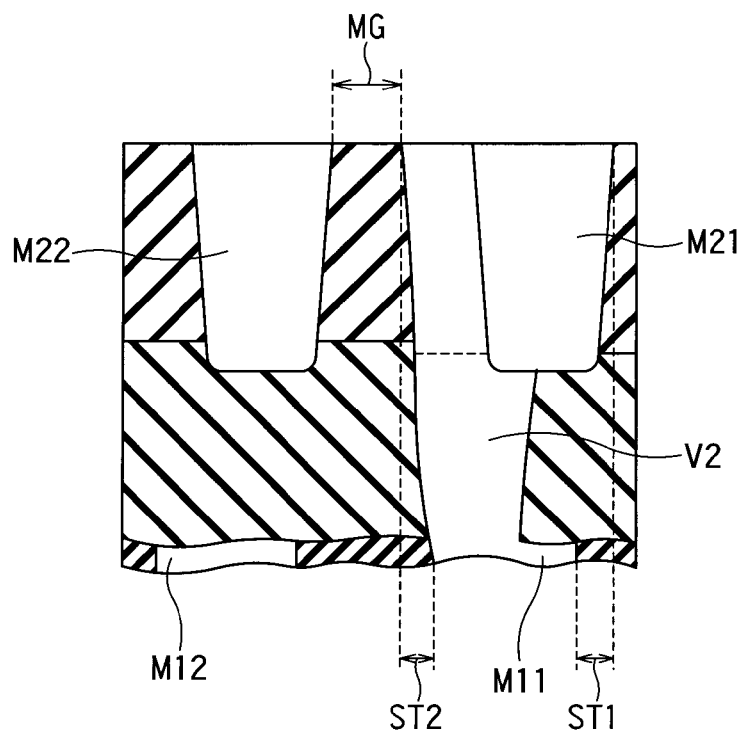

Then, extra copper (Cu) on the silicon nitride (SiN) film 19 and the barrier metal 45 are removed by, for example, the CMP method, and the silicon nitride (SiN) film 19 is then removed to form a copper (Cu) wiring line 51, as shown in FIG. 15. The copper (Cu) wiring line 51 corresponds to, for example, an upper embedded wiring line in the present embodiment.

Subsequently, the steps described with FIG. 1 to FIG. 15 can be repeated as required to form a desired multilevel wiring line.

Thus, according to the present embodiment, when a multilevel wiring layer having a hybrid structure is formed by the dual damascene process, the via pattern Pv is first produced, and then the wiring groove pattern Pw is formed by directly aligning the wiring groove pattern Pw with the via pattern Pv, so that even with the difficulty in scale, it is highly unlikely that a short circuit is caused. This makes it possible to manufacture the via-connected multilevel wiring layer with high accuracy in a simple process.

While one embodiment of the semiconductor device manufacturing method according to the present invention has been described above, it should be understood that the present invention is not at all limited to the embodiment described above, and various modifications can be made within the technical scope thereof. For example, each of the first to fourth insulating films is constituted of a single layer in the case described in the above embodiment, but the present invention is not limited to this, and each of insulating films can be constituted of a film having a plurality of layers.

What is claimed is:

1. A semiconductor device manufacturing method comprising:
    sequentially forming first to fourth insulating films and first to third hard masks on a substrate in which a wiring layer serving as a lower embedded wiring line is formed;
    aligning a mask in which a mask pattern corresponding to a via pattern is formed with the embedded wiring layer to selectively remove the third hard mask and the second hard mask in order to form the via pattern;
    aligning a mask in which a mask pattern corresponding to a wiring groove pattern is formed with the via pattern to selectively remove the third hard mask and part of the second hard mask in order to form the wiring groove pattern;
    selectively removing the first hard mask and the fourth insulating film using the second hard mask as an etching mask to form a via pattern in the first hard mask and the fourth insulating film in a self-aligning manner, and also removing part of the second hard mask remaining under the bottom surface of the wiring groove pattern;
    selectively removing the first hard mask using the second hard mask in which the wiring groove pattern is formed as an etching mask after the removal of the third hard mask to form a wiring groove pattern in the first hard mask in a self-aligning manner;
    selectively removing the third insulating film using the fourth insulating film having the via pattern as an etching mask to form a via pattern in the third insulating film in a self-aligning manner;
    selectively removing the fourth insulating film using the first hard mask having the wiring groove pattern as an etching mask to form a wiring groove pattern in the fourth insulating film in a self-aligning manner, and also selectively removing the second insulating film using the fourth insulating film having the via pattern as an etching mask to form a via pattern in the second insulating film in a self-aligning manner;
    selectively removing the first insulating film using the third insulating film having the via pattern as an etching mask to form an opening reaching the wiring layer, after the removal of the second hard mask;
    selectively removing the third insulating film using the first hard mask having the wiring groove pattern as an etching mask to form a wiring groove pattern in the third insulating film in a self-aligning manner; and
    embedding conductors in the wiring groove pattern and the via pattern to form a via and an upper wiring line connected to the lower embedded wiring line through the via.

2. The semiconductor device manufacturing method according to claim 1,
    wherein the first insulating film contains silicon (Si) and carbon (C).

3. The semiconductor device manufacturing method according to claim 1,
    wherein the second insulating film is made of an inorganic material having a silicon-oxygen (Si-O) backbone.

4. The semiconductor device manufacturing method according to claim 1,
    wherein the fourth insulating film is made of an inorganic material having a silicon-oxygen (Si-O) backbone.

5. The semiconductor device manufacturing method according to claim 1,
    wherein the third insulating film is made of a material which contains carbon as the main component without containing Si.

6. The semiconductor device manufacturing method according to claim 1,
    wherein the second hard mask is made of an inorganic material having a silicon-oxygen (Si-O) backbone.

7. The semiconductor device manufacturing method according to claim 1,
    wherein the second hard mask is thicker than the first hard mask.

8. The semiconductor device manufacturing method according to claim 7,
    wherein the second hard mask has such a thickness that a mask in which a mask pattern corresponding to the wiring groove pattern is formed is sufficiently easily aligned with the via pattern.

9. The semiconductor device manufacturing method according to claim 1,
    wherein the third hard mask and the second hard mask are selectively removed at an etching ratio selected so that the first hard mask is not penetrated.

* * * * *